United States Patent [19]

Matsumura et al.

[11] Patent Number: 5,053,999
[45] Date of Patent: Oct. 1, 1991

[54] SEMICONDUCTOR MEMORY DEVICE HAVING REDUNDANCY AND CAPABLE OF SEQUENTIALLY SELECTING MEMORY CELL LINES

[75] Inventors: Tetsuya Matsumura; Masahiko Yoshimoto, both of Hyogo, Japan

[73] Assignee: Mitsubishi Denki Kabushiki Kaisha, Tokyo, Japan

[21] Appl. No.: 500,328

[22] Filed: Mar. 28, 1990

[51] Int. Cl.$^5$ ............................................. G11C 13/00
[52] U.S. Cl. ................................. 365/200; 365/189.01
[58] Field of Search ............. 365/200, 189.01, 189.05, 365/230.03

[56] References Cited

U.S. PATENT DOCUMENTS

| | | | |
|---|---|---|---|
| 4,817,056 | 3/1989 | Furutina et al. | 365/200 |
| 4,860,260 | 8/1989 | Saito et al. | 365/200 |
| 4,885,721 | 12/1989 | Katanosaka | 365/200 |
| 4,914,632 | 4/1990 | Fujishima | 365/200 |

Primary Examiner—Terrell W. Fears
Attorney, Agent, or Firm—Lowe, Price, LeBlanc and Becker

[57] ABSTRACT

First-In First-Out (FIFO) memory device is disclosed. A ring pointer circuit sequentially and repeatedly selects memory cells in a memory cell array. When it is detected that a defective memory cell exists on a memory cell row, selection of that memory cell row is invalidated by the ring pointer circuit by cutting off a laser trimming line. In addition, by selectively cutting off laser trimming lines in a switching circuit and a redundancy ring pointer circuit, a redundancy memory cell row is selectively added in place of the defective memory cell row. Accordingly, stages required for the ring pointer circuit are maintained. In other words, the FIFO memory device having a defective memory cell is saved, resulting in improvement in yield in the manufacture.

14 Claims, 5 Drawing Sheets

SEMICONDUCTOR MEMORY DEVICE HAVING REDUNDANCY AND CAPABLE OF SEQUENTIALLY SELECTING MEMORY CELL LINES

CROSS-REFERENCE TO RELATED APPLICATIONS

This application is related to copending application Ser. No. 137,145, filed Dec. 23, 1987, commonly assigned with the present invention.

BACKGROUND OF THE INVENTION

1. Field of the Invention

The present invention relates generally to semiconductor memory devices, and more particularly, to a semiconductor memory device capable of sequentially selecting memory cell lines and having redundancy. The present invention is particularly applicable to a First-In First-Out (FIFO) memory device.

2. Description of the Background Art

FIFO memory device is well known as a semiconductor memory device having First-In First-Out function (referred to as "FIFO" hereinafter). Stored data in memory cells are read out in the order in which they are written. More specifically, out of the stored data, the oldest is sequentially read out. Accordingly, the FIFO memory device is often used in order to temporarily hold the data to adjust timings in case of data transmission between devices or circuits each having a different processing speed.

FIG. 1 is a block diagram of a conventional FIFO memory device. Referring to FIG. 1, the FIFO memory device comprises a memory cell array 1 having a number of memory cells arranged in matrix of n bits by k rows, a ring pointer circuit 2 for sequentially and repeatedly selecting respective rows of the memory cell array 1, an input driver circuit 3 for supplying input data signals DI1 to DIn of n bits to the memory cell array 1, an output driver circuit 4 for reading data signals from the memory cell array 1, and a control circuit 5. One row of the memory cell array 1 comprises n numbers of memory cells. The ring pointer circuit 2 is connected to receive a clock signal $\phi$ and a reset signal $\overline{RS}$ generated from the control circuit 5.

In the writing operation, the input data signals DI1 to DIn to be written are supplied to the memory cell array 1 through the input driver circuit 3. After being reset by the reset signal $\overline{RS}$, the ring pointer circuit 2 sequentially selects each row of the memory cell array 1 in response to the clock signal $\phi$. Accordingly, the supplied input data signals DI1 to DIn are written in each row selected by the ring pointer circuit 2. Also in the reading operation, the ring pointer circuit 2 sequentially selects each row of the memory cell array 1 in the same manner as in the writing operation. Accordingly, data signals DO1 to DOn are read out through the output driver circuit 4 in the order in which they are written. Each row of the memory cell array 1 is selected in response to address signals AD1 to ADk outputted from the ring pointer circuit 2.

FIG. 2 is a circuit block diagram of the ring pointer circuit 2 shown in FIG. 1. Referring to FIG. 2, the ring pointer circuit 2 comprises circularly cascaded flip-flops 6, 72 through 7k. Accordingly, the ring pointer circuit 2 having k stages is constituted. Each flip-flop is connected to receive the clock signal $\phi$ and the reset signal $\overline{RS}$ outputted from the control circuit 5 shown in FIG. 1. Each of the flip-flops 6, 72 through 7k has a data input terminal 8, a master data output terminal 9, a slave data output terminal 10, a clock input terminal 11 and a reset terminal 12. A slave data output terminal 10 of a flip-flop in a preceding stage is connected to a data input terminal 8 of a flip-flop in a succeeding stage. A slave data output terminal 10 of a flip-flop in the k-th stage is connected to a data input terminal 8 of a flip-flop in the first stage to constitute a ring pointer. Each of the flip-flops 6, 72 through 7k receives the clock signal $\phi$ and the reset signal $\overline{RS}$ through the clock input terminal 11 and the reset terminal 12. The flip-flops 6, 72 through 7k output the address signals AD1 to ADk through the master data output terminal 9, respectively. The address signals AD1 to ADk are supplied to the memory cell array 1, as described above.

FIG. 3 is a circuit diagram of the flip-flop 6 in the first stage shown in FIG. 2. Referring to FIG. 3, the flip-flop 6 comprises NMOS transistors 13 and 14, PMOS transistors 15 and 16, four inverters 17, 18, 19 and 20, a NOR gate 21 and an NAND gate 22. This flip-flop 6 also comprises a master latch 6m and a slave latch 6s.

During the operation, when the reset signal $\overline{RS}$ of a low (logical low) level is supplied, a signal of a high (logical high) level is outputted as a master data output DOm through the terminal 9, irrespective of a level of the clock signal $\phi$. On the other hand, when the reset signal $\overline{RS}$ of a high level is supplied, the flip-flop 6 operates as a general master slave type flip-flop. More specifically, the flip-flop 6 outputs input data DI supplied through the data input terminal 8, through the data output terminal 9, in response to the rise of the clock signal $\phi$. In addition, in response to the fall of the clock signal $\phi$, the master data output DOm is latched in the master latch 6m and supplied to the slave latch 6s. The data signal supplied to the slave latch 6s is outputted as a slave data output DOs through the slave data output terminal 10.

FIG. 4 is a circuit diagram showing one of the flip-flops 72 to 7k. Referring to FIG. 4, this flip-flop 7 comprises NMOS transistors 23 and 24, PMOS transistors 25 and 26, three inverters 27, 28 and 29, and NAND gates 30 and 31. The flip-flop 7 also includes a master latch 7m and a slave latch 7s.

During the operation, when the reset signal $\overline{RS}$ of the low level is supplied, the flip-flop 7 outputs two low level signals through the terminals 9 and 10 as a master data output DOm and a slave data output DOs, respectively irrespective of a level of the clock signal $\phi$. On the other hand, when the reset signal $\overline{RS}$ of the high level is supplied, the flip-flop 7 operates as a general master slave type flip-flop. More specifically, the input data DI supplied through the terminal 8 is outputted as the master data output DOm through the terminal 9, in response to the rise of the clock signal $\phi$. The master data output DOm is latched in the master latch 7m, in response to the fall of the clock signal $\phi$. At the same time, the master data output DOm is supplied to the slave latch 7s and outputted as the slave data output DOs through the terminal 10.

Now, with reference to the timing chart shown in FIG. 5, operation of the ring pointer circuit 2 shown in FIG. 2 will be described. First, in a period P1, the reset signal $\overline{RS}$ of the low level is supplied through each terminal 12 shown in FIG. 2. Accordingly, only the first flip-flop 6 outputs the address signal AD1 of the high level through the terminal 9. On the other hand, the other flip-flops 72 to 7k output the address signals AD2 to ADk of the low level, in response to the reset signals e,ovs/RS/ of the low level.

Then, in a period $P_2$ and thereafter, the reset signal $\overline{RS}$ of the high level is supplied. When the clock signal $\phi$ rises, only the second flip-flop 72 outputs the master data output DOm, that is, the address signal AD2 of the high level through the terminal 9. Other flip-flops than the flip-flop 72 output address signals of the low level. When the clock signal $\phi$ falls, the master data output DOm of the second flip-flop 72 is latched to the high level.

Furthermore, in a period $P_3$, only the third flip-flop (not shown) outputs the address signal AD3 of the high level. Through the repetition of the above described operation, the flip-flops 6, 72 through 7k sequentially output the address signals AD1 to ADk of the high level.

In a period $P_k$, in response to a fall of the k-th clock signal $\phi$, the master data output DOm of the k-th flip-flop 7k is latched to the high level. In response to a subsequent fall of the clock signal $\phi$, the first flip-flop 6 outputs the master data output DOm of the high level.

Accordingly, so long as no reset signal e,ovs/RS/ of the low level is supplied, the address signals AD1 to ADk sequentially and repeatedly attain the high level in response to the clock signal $\phi$. As a result, each row of the memory cell array 1 shown in FIG. 1 is sequentially and repeatedly selected.

Meanwhile, in general, a predetermined test is applied to a semiconductor memory devices before shipping in order to detect defects and eliminate the same. In the test, it is detected whether a defective memory cell exists in a memory cell array or not. Also with respect to a FIFO memory device, it is detected whether or not a defective memory cell exists. If a defective memory cell exists in the memory cell array, the FIFO memory device should be treated as defective. The reason is that in a conventional FIFO memory device, it is not possible to avoid selecting a memory cell line having a defective memory cell.

SUMMARY OF THE INVENTION

One object of the present invention is to avoid selection of a memory cell line in which a defective memory cell exists, in a semiconductor memory device capable of sequentially selecting memory cell lines.

Another object of the present invention is to improve yield in the manufacture of a semiconductor memory device capable of sequentially selecting memory cell lines.

Yet another object of the present invention is to provide a redundancy circuitry in a semiconductor memory device capable of sequentially selecting memory cell lines.

Still another object of the present invention is to save a memory device having a defective memory cell in a semiconductor memory device capable of sequentially selecting memory cell lines.

Still another object of the present invention is to use a redundancy memory cell line provided with redundancy memory cells in place of a memory cell line in which a defective memory cell exists, in a semiconductor memory device capable of sequentially selecting memory cell lines.

Still another object of the present invention is to avoid selection of a memory cell line in which a defective memory cell exists, in a FIFO memory device capable of sequentially selecting memory cell lines.

Still another object of the present invention is to improve yield in the manufacture of a FIFO memory device capable of sequentially selecting memory cell lines.

Still another object of the present invention is to provide a redundancy circuitry in a FIFO memory device capable of sequentially selecting memory cell lines.

Briefly stated, a semiconductor memory device according to the present invention comprises a memory cell array having memory cells disposed on k numbers of memory cell lines, a line selecting circuitry responsive to an externally supplied clock signal for sequentially selecting the k numbers of memory cell lines, an access circuit for accessing memory cells on the memory cell line selected by the line selecting circuit, and a selection invalidating circuitry responsive to an externally supplied first designation for invalidating the selection of the designated memory cell line by the line selecting circuitry.

In the operation, when it is detected that a memory cell on a specific memory cell line is defective, the defective memory cell line is externally designated. In response to the designation, the selection invalidating circuitry invalidates the selection of the designated memory cell lines by the line selecting circuitry. Accordingly, the access circuitry is prevented from accessing the defective memory cell line.

In a preferred embodiment, a semiconductor memory device according to the present invention further comprises a redundancy memory cells disposed on at least one redundancy memory cell line, and a selection increasing circuitry responsive to an externally supplied second designation for increasing the number of memory cell lines to be sequentially selected by a line selecting circuitry.

In the operation, the selection increasing circuitry increases the number of memory cell lines to be sequentially selected by the line selecting circuitry, in response to the externally supplied designation. Accordingly, in response to the clock signal, the line selecting circuitry sequentially selects the memory cell lines including the redundancy memory cell line. As a result, by the use of the redundancy memory cell line in place of the defective memory cell line, the number of memory cell lines which can be accessed by the access circuitry is maintained.

In a further preferred embodiment, the present invention can be applied to a FIFO memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
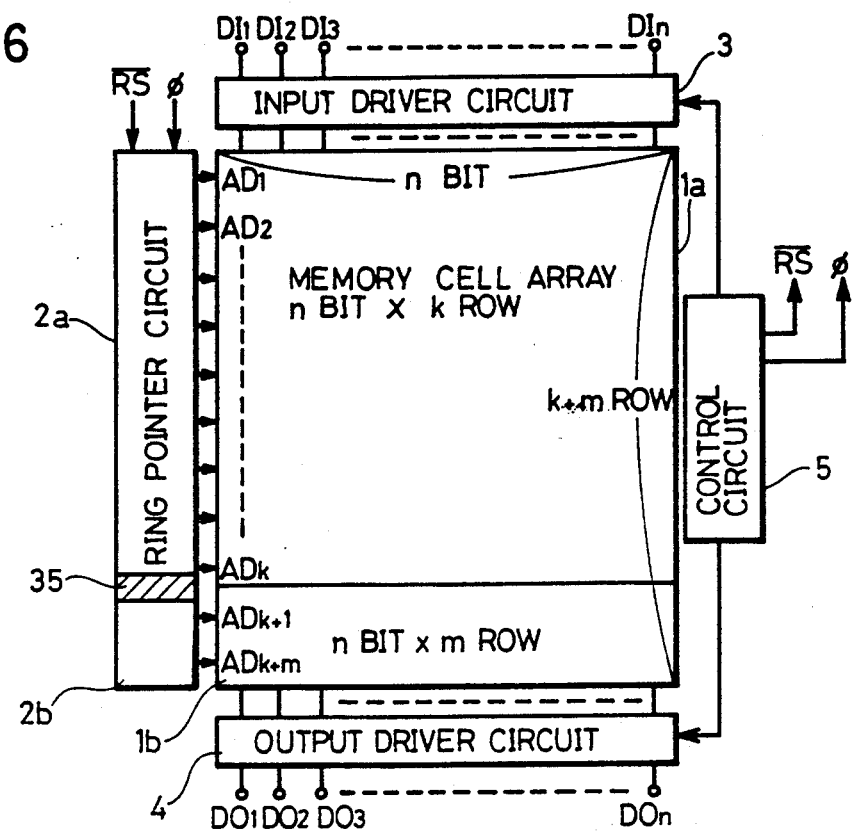
FIG. 6 a block diagram of a FIFO memory derived according to one embodiment of the present invention.

FIG. 6 shows a FIFO memory device according to one embodiment of the present invention. Referring to FIG. 6, the FIFO memory device comprises a memory cell array 1 having n bits by k rows, a redundancy memory cell array 1b having n bits by m rows, a ring pointer circuit 2a and a redundancy ring pointer circuit 2b for constituting one ring pointer, an input driver circuit 3 for supplying input data DIl to DIn to be written, to the memory cell arrays 1a and 1b, an output driver circuit 4 for reading stored data signals from the memory cell arrays 1a and 1b, and a control circuit 5. The ring pointer circuits 2a and 2b are connected to receive a clock signal $\phi$ and a reset signal e,ovs/RS/ outputted from the control circuit 5.

Figure 1:
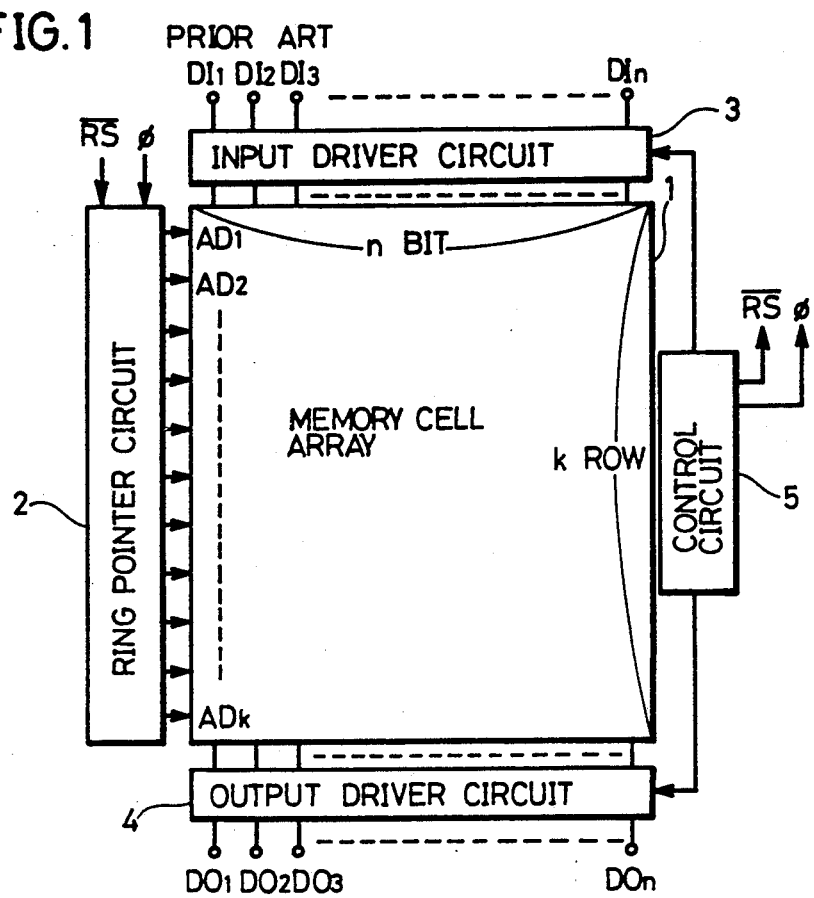
FIG. 1 is a block diagram of a conventional FIFO memory device.
Figure 5:
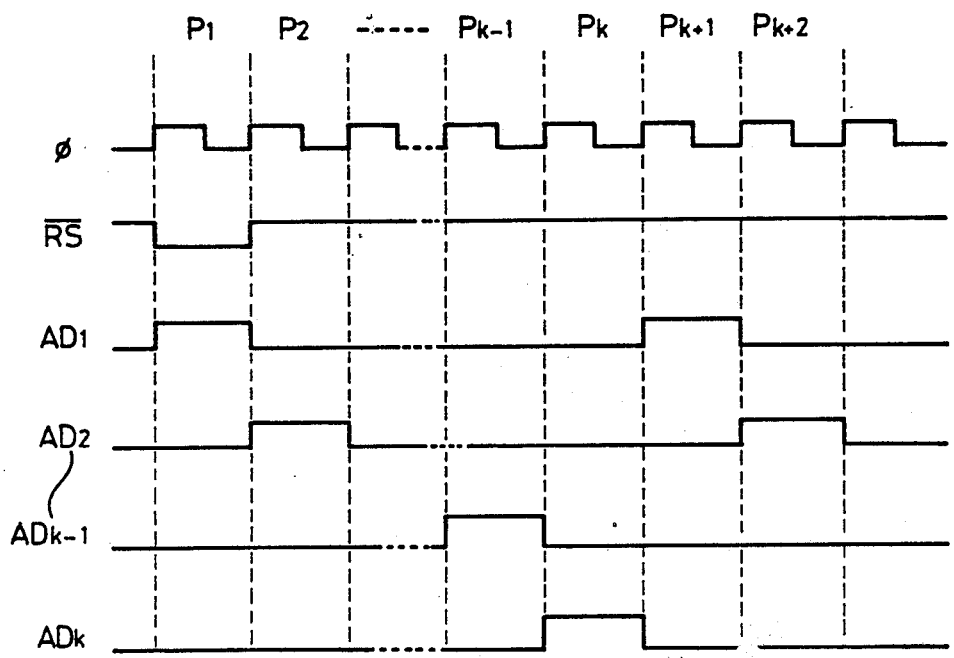
FIG. 5 is a timing chart for explaining operation of the ring pointer circuit show in FIG. 2.
Figure 2:
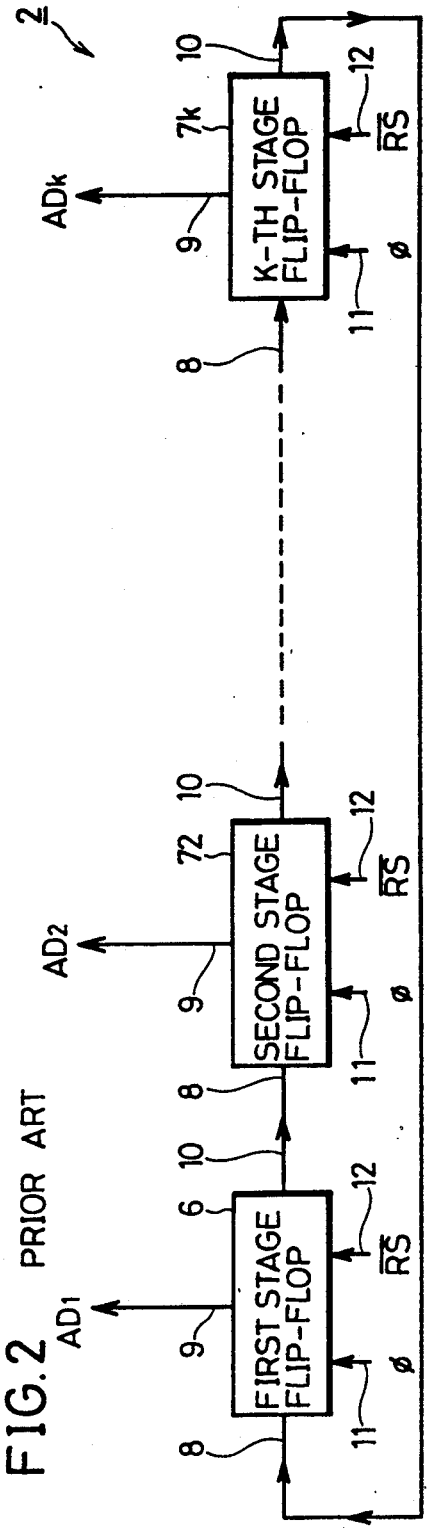
FIG. 2 is a circuit block diagram of a ring pointer circuit shown in FIG. 1.

The memory cell array 1a has the same storage capacity as that of the memory cell array 1 shown in FIG. 1. In addition, the redundancy memory cell array 1b is further provided. In response to the clock signal $\phi$, the ring pointer circuit 2a sequentially and repeatedly selects each row of the first row through the k-th row of the memory cell array 1a. A switching circuit 35 is connected between the ring pointer circuits 2a and 2b. Function of the switching circuit 35 allows also the redundancy ring pointer circuit 2b to select the (k+1)th row through the (k+m)th row of the memory cell array 1b.

Figure 7:
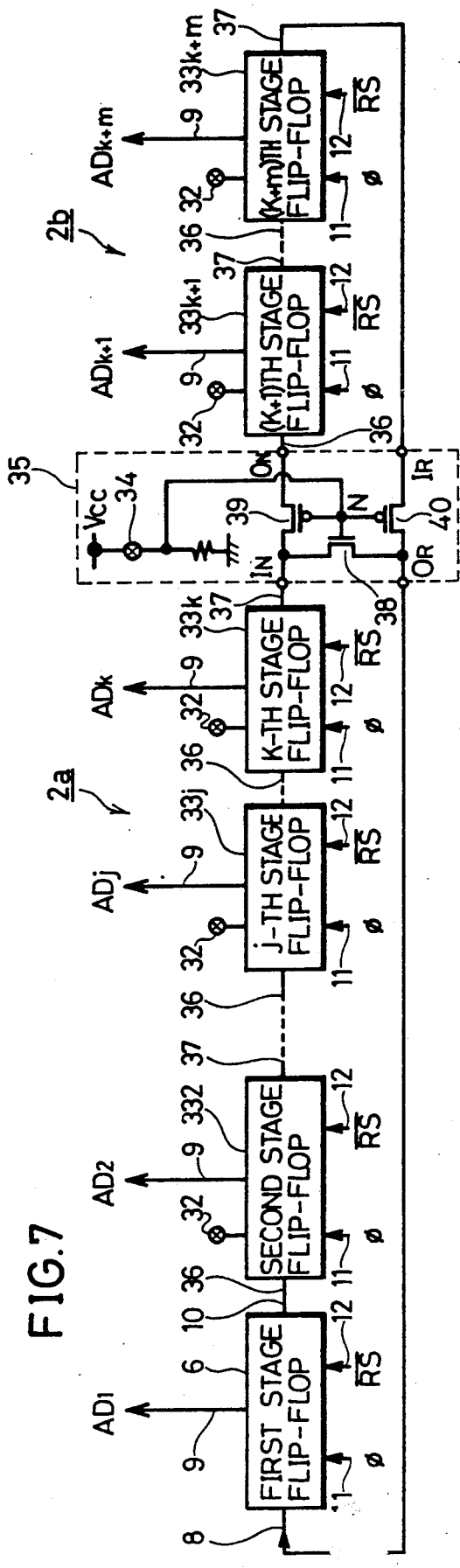
FIG. 7 is a circuit block diagram of a ring pointer circuit, a redundancy pointer circuit and a switching circuit shown in FIG. 6.
Figure 3:
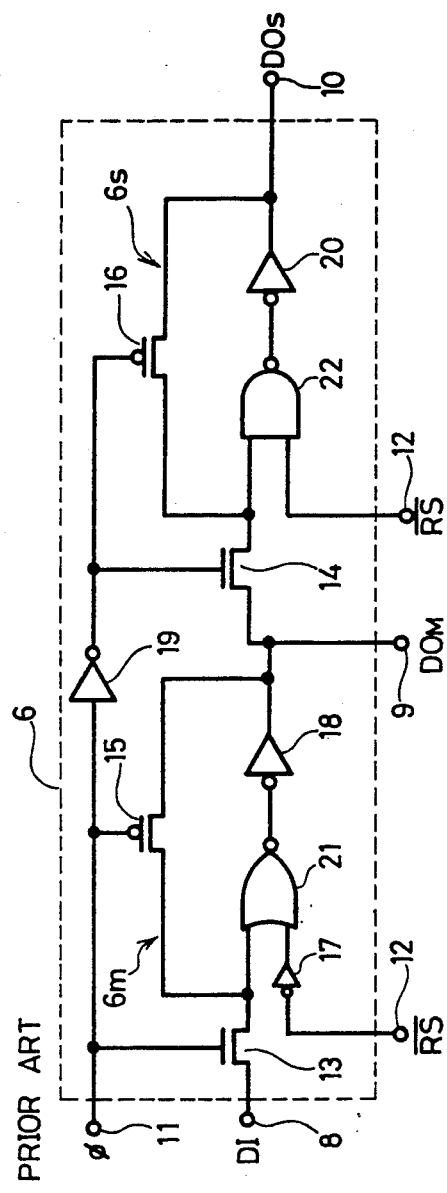
FIG. 3 is a circuit diagram of a flip-flop in the first stage shown in FIG. 2.

FIG. 7 shows the ring pointer circuit 2a, the redundancy ring pointer circuit 2b and the switching circuit 35 shown in FIG. 6. Referring to FIG. 7, the ring pointer circuit 2a comprises cascaded flip-flops 6, 332 through 333k of k stages. Each of the flip-flops 6, 332 through 33k is connected to receive the clock signal $\phi$ and the reset signal e,ovs/RS/. In addition, each of the flip-flops 6, 332 through 33k has a laser trimming node, that is, a laser trimming line 32.

The redundancy pointer circuit 2b comprises m numbers of cascaded flip-flops $33_{k+l}$ through $33_{k+m}$. These flip-flops are also connected to receive the clock signal $\phi$ and the reset signal e,ovs/RS/.

The switching circuit 35 is connected between the ring pointer circuit 2a and the redundancy ring pointer circuit 2b. The switching circuit 35 comprises an NMOS transistor 38 connected between an input terminal $I_N$ and a return output terminal $O_R$, a PMOS transistor 39 connected between the input terminal $I_N$ and an output terminal $O_N$, and a PMOS transistor 40 connected between a return input terminal $I_R$ and the return output terminal $O_R$. Each of the transistors 38, 39 and 40 has a node connected together to a node N. The node N is connected to a power supply Vcc through a laser trimming node, that is, a laser trimming line 34.

The laser trimming nodes, i.e. laser trimming lines 32 and 34 are selectively cut off by the irradiation by the laser. Accordingly, when the laser trimming node 34 in the switching circuit 35 is not cut off, the transistor 38 is turned on and the transistors 39 and 40 are turned off. As a result, a ring pointer having k stages is constituted through the transistor 38. On the other hand, when the laser trimming node 34 is cut off, the transistor 38 is turned off and the transistors 39 and 40 are turned on.

Figure 4:
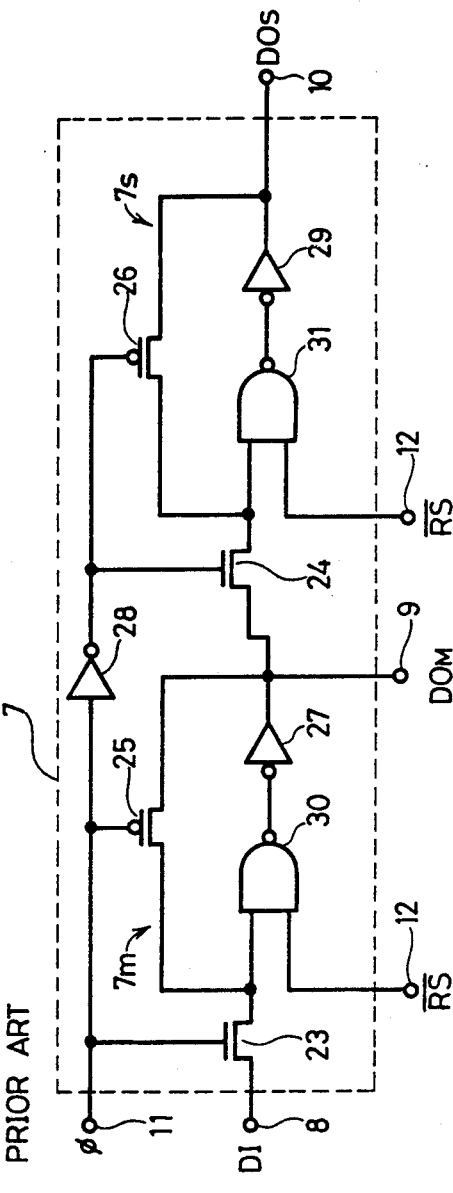
FIG. 4 is a circuit diagram of a flip-flop in the second stage through the k-th stage shown in FIG. 2.
Figure 8:
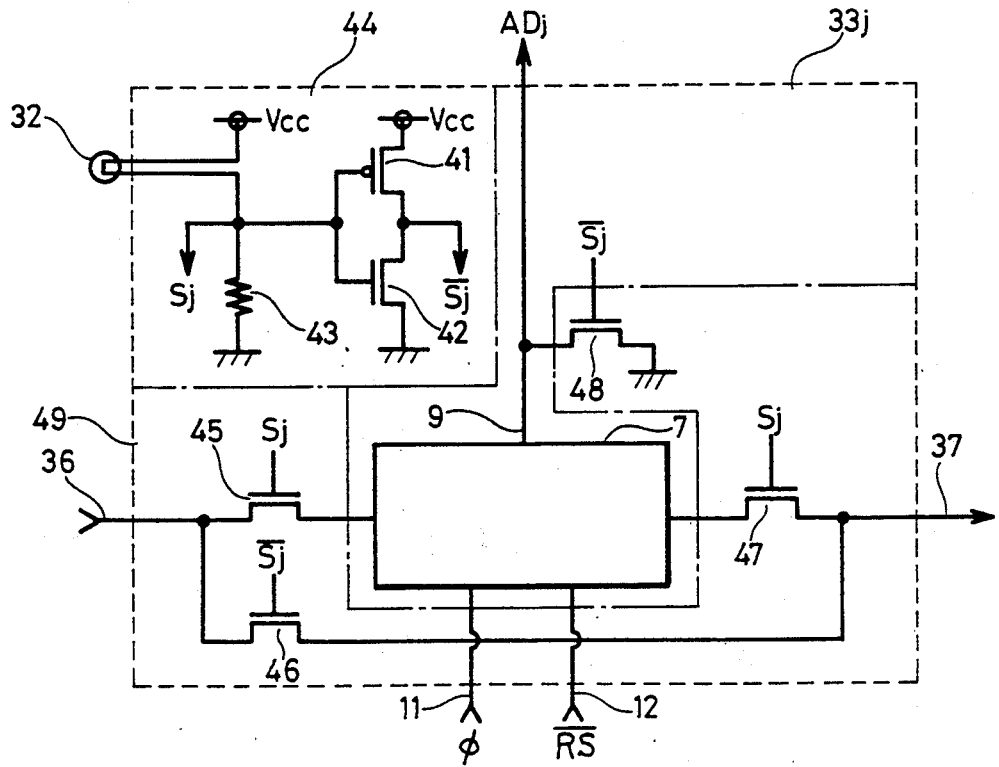
FIG. 8 is a circuit diagram of a flip-flop in the second stage through the (k+m)th stage shown in FIG. 7.

FIG. 8 shows one of the flip-flops 332 to $33_{k+m}$ shown in FIG. 7. Referring to FIG. 8, a flip-flop 33j comprises a flip-flop 7 of the same circuit structure as that of the flip-flop 7 shown in FIG. 4, a by-pass setting circuit 44 having a laser trimming node 32, and a by-pass control circuit 49. The by-pass setting circuit 44 comprises the laser trimming node 32 and a pull-up resistor 43 connected in series between a power supply Vcc and a ground, and a PMOS transistor 41 and an NMOS transistor 42 constituting an inverter. A control signal Sj for controlling the by-pass control circuit 49 is outputted from a common connection node of the laser trimming node 32 and the pull-up resistor 43. In addition to this, a control signal $\overline{Sj}$ inverted through a common connection node of the transistors 41 and 42 is outputted. These control signals Sj and $\overline{Sj}$ are supplied to the by-pass control circuit 49.

The by-pass control circuit 49 comprises four NMOS transistors 45, 46, 47 and 48. Each of the transistors 45 and 47 has a gate connected to receive the control signal Sj. Each of the transistors 46 and 48 has a gate connected to receive the control signal $\overline{Sj}$.

In the operation, when the laser trimming node, that is, the laser trimming line 32 is not cut off, the by-pass setting circuit 44 outputs the signal Sj of the high level and the signal $\overline{Sj}$ of the low level. Accordingly, the transistors 45 and 47 in the by-pass control circuit 49 are turned on and the transistor 46 is turned off. Accordingly, since an input terminal and an output terminal of the flip-flop 7 are connected to a data input terminal 36 and a slave data output terminal 37, respectively, this flip-flop 33j operates as a general master slave type flip-flop.

On the other hand, when the laser trimming line 32 is cut off, the by-pass setting circuit 44 outputs the signal Sj of the low level and the signal $\overline{Sj}$ of the high level. Accordingly, The transistors 45 and 47 are turned off and the transistor 46 is turned on. As a result, the data input terminal 36 and the slave data output terminal 37 are directly connected with each other through the transistor 46. This means that a slave data output of a flip-flop connected to a preceding stage ((j−1)th stage) is directly supplied to a flip-flop in a succeeding stage ((j+1)th stage). In addition, the transistor 48 is turned on, in response to the signal $\overline{Sj}$ of the high level. The transistor 48 has a low on-resistance. Accordingly, the master data output terminal 9 of the flip-flop 7 is forcibly caused to attain the low level, whereby an address signal ADj of a low level is outputted.

In general, a semiconductor device is tested in a factory before shipping to determine whether it is defective or not. A FIFO memory device is also tested to determine whether a defective memory cell exists or not. In case no defective memory cell exists in the FIFO memory device, all of the laser trimming nodes, i.e. laser trimming lines 32, are not cut off. Accordingly, a ring pointer having k stages is constituted by the ring pointer circuit 2a and the switching circuit 35 shown in FIG. 6. More specifically, the transistor 38 in the switching circuit 35 shown in FIG. 7 is turned on to form a loop for constituting a ring pointer having the k stages. In this case, the operation will be as follows.

First, the reset signal e,ovs/RS/ falls and only the flip-flop 6 in the first stage outputs the address signal Adl of the high level. Subsequently, the respective flip-flops 332 to 33k sequentially output the address signals AD2 to ADk of the high level, in response to the supplied clock signals $\phi$. After the flip-flop 33k outputs the address signal ADk of the high level, the flip-flop 6 in the first stage again outputs the address signal AD1 of the high level. After that, this operation is repeated to sequentially and repeatedly select each row in the memory cell array 1a designated by one of the address signals AD1 to ADk of the high level.

Then, in case one memory cell on the j-th row in the memory cell array 1a is defective, the laser trimming line 32 of the flip-flop 33j in the j-th stage in the ring pointer circuit 2a shown in FIG. 7 is cut off. Accordingly, the by-pass setting circuit 44 shown in FIG. 8 outputs the signal Sj of the low level and the signal $\overline{Sj}$ of the high level. Consequently, as described above, the transistors 46 and 48 are turned on and the transistors 45 and 47 are turned off. Accordingly, the address signal ADj is fixed to the low level, thereby avoiding a selection of the j-th row in the memory cell array 1a.

In addition, the input terminal 36 and the output terminal 37 are connected through the transistor 46. This means that cutting off the laser trimming line 32 is equivalent to invalidating of flip-flops constituting a ring pointer. As the result, an output signal of the flip-flop in the (j−1)th stage is directly supplied to the flip-flop in the (j+1)th stage.

The above described operation in the presence of a defective memory cell ensures the function of a ring pointer having (k−1) stages in the FIFO memory device. The following operation further ensures the function of a ring pointer having k stages. More specifically, the laser trimming line 34 in the switching circuit 35 is cut off and in addition, the laser trimming lines 32, except for the flip-flop $33_{k+1}$ in the (k+1)th stage, the flip-flops $33_{k+2}$ through $33_{k+m}$ in the succeeding stages are cut off. By cutting off the laser trimming line 34 in the switching circuit 35, the transistor 38 is turned off and the transistors 39 and 40 are turned on. Accordingly, the input terminal $I_N$ of the switching circuit 35 is connected to the output terminal $O_N$ through the transistor 39. The input terminal $I_R$ is also connected to the return output terminal $O_R$ through the transistor 40.

By cutting off each laser trimming line 32 of the flip-flops in the (k+2)th stage through (k+m)th stage, these flip-flops are invalidated. More specifically, in each of these flip-flops, the corresponding by-pass transistor 46 shown in FIG. 8 is turned on, so that the output terminal 37 of the flip-flop $33_{k+1}$ in the (k+1)th stage is electrically connected to the return input terminal $I_R$ of the switching circuit 35 through other flip-flops in the succeeding stages. Accordingly, a ring pointer having the k stages can be achieved by the flip-flops 6, and 332 through 33k in the first through the kth stage, and the flip-flop $33_{k+1}$ in the (k+1)th stage except the flip-flop 33j in the j-th stage. The flip-flop $33_{k+1}$ selects the (k+1)th row in the redundancy memory cell array 1b shown in FIG. 6. This means that the (k+1)th row replaces the j-th row in which a defective memory cell exists.

Accordingly, after the flip-flop 6 in the first stage outputs the address signal AD1 of the high level, in response to the supply of the reset signal e,ovs/RS/ of the low level the address signal AD2 to $AD_{k+1}$ of the high level are sequentially outputted, except the signal ADj. After the flip-flop $33_{k+1}$ in the (k+1)th stage outputs the address signal $AD_{k+1}$ of the high level, the flip-flop 6 in the first stage outputs the address signal AD1 of the high level. The same operation is repeated hereinafter. As a result, the (k+1)th row in the redundancy memory cell array 1b replaces the j-th row having a defective memory cell in the memory cell array 1a to maintain the k rows which the FIFO memory device can select.

While in the above described example, the (k+1)th row in the redundancy memory cell array 1b is used in place of the j-th row, any of the flip-flops $33_{k+2}$ to $33_{k+m}$ in the (k+2)th stage to the (k+m)th stage can be used. Namely, except a flip-flop connected to a row to be used, laser trimming lines 32 in other flip-flops connected to the rows which are not to be used are cut off, so that a ring pointer having the k stages is constituted.

In addition, in case in each of i (i $\geq$ 2) numbers of rows has a defective memory cell, these rows can be replaced with the i numbers of rows in the redundancy memory cell array 1b. Also in this case, the laser trimming line 34 in the switching circuit 35 is cut off. Furthermore, a laser trimming line 32 in each flip-flop connected to each of the i numbers of rows in the memory cell array 1a is cut off and the laser trimming lines 32 in other flip-flops than the i numbers of flip-flops in the redundancy memory cell array 1b are cut off. Accordingly, also in this case, k numbers of rows necessary for a ring pointer in the FIFO memory device can be ensured.

Figure 9:
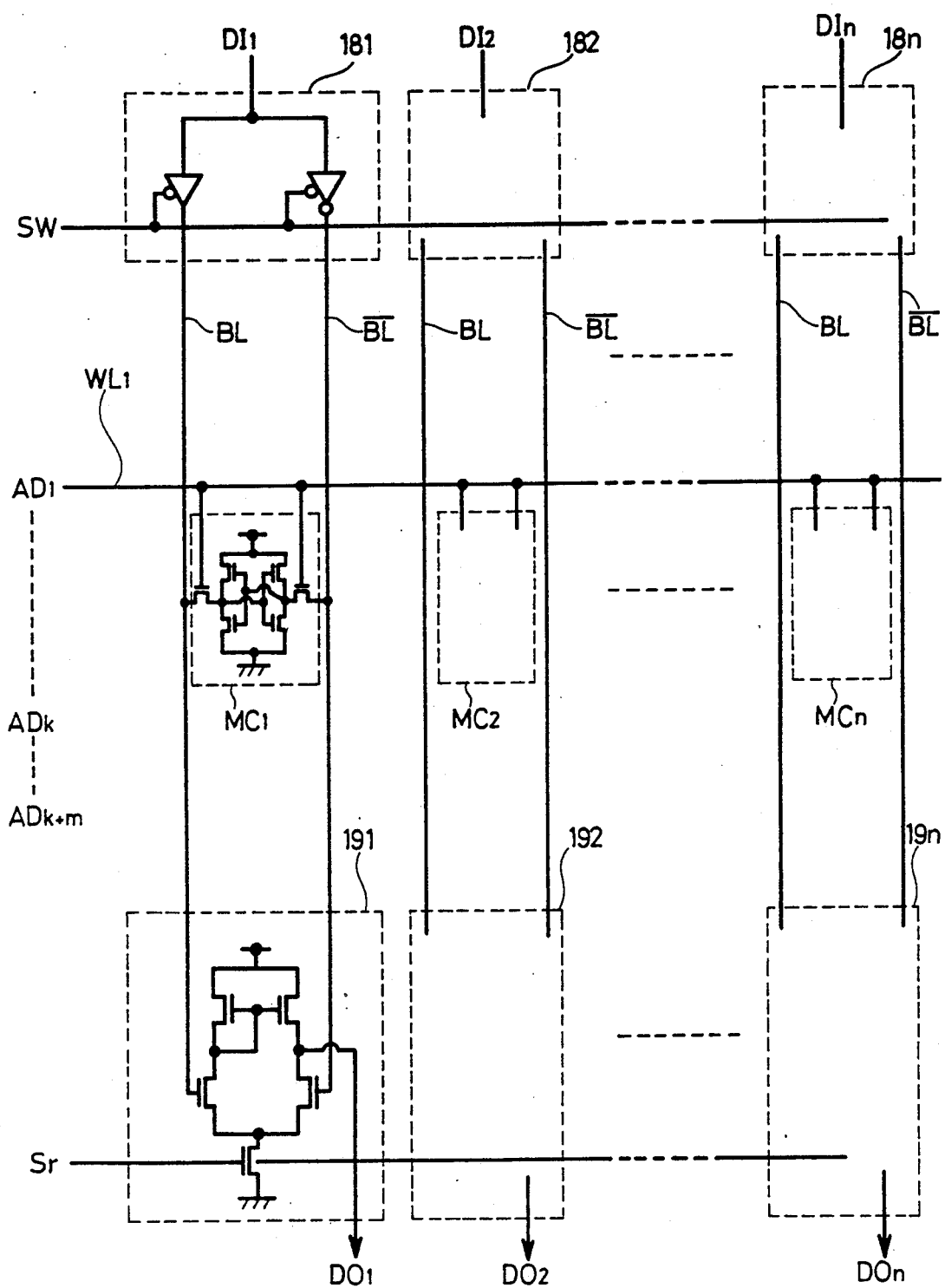
FIG. 9 is a circuit diagram showing an example of an input driver circuit and an output driver circuit shown in FIG. 6.

FIG. 9 shows one example of the input driver circuit 3 and the output driver circuit 4 shown in FIG. 6. Referring to FIG. 9, each row of a memory cell array comprises n numbers of memory cells MC1 to MCn. The memory cells MC1 to MCn are connected to input drivers 18l through 18n and to output drivers (sense amplifiers) 19l through 19n, respectively, through bit lines BL and $\overline{BL}$. Each of the input drivers 18l to 18n is activated in response to a writing activation signal $S_w$. Similarly, each of the output drivers 19l to 19n is activated in response to a reading activation signal Sr. For example, the memory cell rows MC1 to MCn constituting one row are connected to receive an address signal AD1 through a word line WL1 and selected, in response to the signal AD1.

In the writing operation, input data Dl1 to Dln to be written in the input drivers 18l to 18n are supplied. After the input driver 18l to 18n are activated, the supplied n-bit input data Dl1 to Dln are written in memory cells on a row designated by one of the address signals AD1 to $AD_{k+m}$. In the reading operation, the output driver 19l to 19n are activated in response to the reading activation signal Sr, so that amplified output data DO1 to DOn of n bits are outputted.

While in the embodiment shown in FIG. 6, description is made of a case wherein the rows in the memory cell arrays 1a and 1b are selected by the ring pointer circuits 2a and 2b, respectively, it is pointed out that the present invention can be applied to select columns in the memory cell arrays 1a and 1b. To put it concretely, in order to select activation of the input driver circuits or the output driver circuit 4, a ring pointer circuit is often employed for selecting the columns in the memory cell arrays 1a and 1b. Also in such a case, the present invention can be applied in order to replace an unnecessary column in which a defective memory cell exists with a preliminary prepared redundancy memory cell column.

Furthermore, while in the above described embodiment, the example of the application of the FIFO memory device is described, generally the present invention can be applied to a semiconductor memory device having a ring pointer circuit for sequentially and repeatedly selecting memory cell lines. Accordingly, it can be pointed that the present invention is applicable as a row or column selecting ring pointer circuit for the writing in the memory cell arrays, or as a row or column selecting ring pointer circuit for the reading from the memory cell arrays.

While in the embodiment of FIG. 6, the laser trimming nodes, that is, the laser trimming lines 32 and 34 are employed for the invalidation of a column having a defective memory cell, the validation of a redundancy memory cell column to be replaced and programming for the selection in the switching circuit 35, an electric fuse which can be cut off by currents can be used instead of those. Furthermore, in place of that, a polysilicon fuse which can be electrically cut off by laser annealing can be used.

As the foregoing, in the FIFO memory device shown in FIG. 6, by cutting off the laser trimming line 32 of the flip-flop 33j in the j-th stage, selection of the flip-flop 33j is invalidated. Accordingly, the selection of the j-th row having a defective memory cell can be avoided. In addition, the selective cutting off of the laser trimming lines 34 and 32 of the switching circuit 35 and the redundancy ring pointer circuit 2b allows the redundancy flip-flop $33_{k+1}$ to select the (k+1)th redundancy memory cell row prepared previously. Accordingly, in place of the j-th memory cell row which is not selected, the (k+1)th redundancy memory cell row is used. As a result, k stages necessary for the ring pointer in the FIFO memory device are maintained. That is, the FIFO memory device having a defective memory cell can be saved, thereby improving yield in the manufacture. The present invention is generally applicable to a semiconductor memory device sequentially and repeatedly selecting memory cell lines, so that improvement in yield in the manufacture can be achieved by using a redundancy circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array having memory cells for storing data signals, said memory cells being disposed on k memory cell lines in said memory cell array,
   line selecting means connected to said memory cell array responsive to an externally supplied clock signal for sequentially selecting said k memory cell lines,
   accessing means connected to said memory cell array for accessing memory cells on a memory cell line selected by said line selecting means, and
   selection invalidating means connected to said accessing means responsive to an externally supplied first designation for invalidating the selection of a designated memory cell line by said line selecting means,
   said line selecting means including ring pointer means connected to said memory cell array responsive to the clock signal for sequentially and repeatedly outputting a selection signal for sequentially selecting memory cell lines.

2. A semiconductor memory device comprising:
   a memory cell array having memory cells for storing data signals, said memory cells being disposed on k memory cell lines in said memory cell array,
   line selecting means connected to said memory cell array responsive to an externally supplied clock signal for sequentially selecting said k memory cell lines,
   accessing means connected to said memory cell array for accessing memory cells on a memory cell line selected by said line selecting means,
   selection invalidating means connected to said accessing means responsive to an externally supplied first designation for invalidating the selection of a designated memory cell line by said line selecting means,
   redundancy memory cells for redundancy, said redundancy memory cells being disposed on at least one redundancy memory cell line, and
   selection increasing means connected to said line selecting means responsive to an externally supplied second designation for increasing memory cell lines to be sequentially selected by said line selecting means,
   said line selecting means sequentially selecting said plurality of memory cell lines and redundancy memory cell lines in response to the clock signal,
   wherein said line selecting means comprises ring pointer means connected to said memory cell array responsive to the clock signal for sequentially and repeatedly outputting a selection signal for sequentially selecting memory cell lines.

3. A semiconductor memory device according to claim 2, wherein said selection increasing means comprises stage increasing means connected to said ring pointer means responsive to said second designation for increasing stages of said ring pointer means.

4. A semiconductor memory device according to claim 3, wherein said ring pointer means comprises
   k signal holding means each responsive to the clock signal for holding a signal supplied from signal holding means in a preceding stage and outputting the signal to a succeeding stage,
   signal holding means in the first stage having an input connected to an output of signal holding means in a k-th stage, each signal holding means supplying a held signal as said selection signal to said memory cell line, in response to the clock signal.

5. A semiconductor memory device according to claim 4, wherein said selection invalidating means comprises:
   first detecting means for detecting said first designation, and
   first switching means connected between an input and an output of each of said signal holding means responsive to said first detecting means for connecting between an input and output of the signal holding means corresponding to the designated memory cell line.

6. A semiconductor memory device according to claim 4, wherein said stage increasing means comprises:
   at least one additional signal holding means responsive to a clock signal for holding a supplied signal and outputting the same,
   second detecting means for detecting said second designation, second switching means connected between the output of said signal holding means in the k-th stage an input of said additional signal holding means responsive to said second detecting means to be turned on, and third switching means connected between an output of said additional holding means and an input of said signal holding means in the first stage responsive to said second detecting means to be turned on, and fourth switching means connected between the output of said signal holding means in the k-th stage and the input of said signal holding means in the first stage responsive to said second detecting means to be turned off.

7. A semiconductor memory device according to claim 6, wherein said at least one redundancy memory cell line includes m numbers of redundancy memory cell lines, said at least one additional signal holding means includes m numbers of cascaded additional signal holding means, and which further comprises:

selecting means connected to each of said additional signal holding means responsive to an externally supplied third designation for selecting the designated signal holding means, the selected signal holding means constituting said ring pointer means having k stages, together with the rest of the signal holding means invalidated by said selection invalidating means.

8. A semiconductor memory device according to claim 7, wherein said signal holding means comprises flip-flop means operative in response to the clock signal.

9. A semiconductor memory device according to claim 1, wherein said accessing means comprises writing means connected to said memory cell array for writing a supplied data signal in memory cells on a memory cell line selected by said line selecting means.

10. A semiconductor memory device according to claim 1, wherein said accessing means comprises sense amplifier means connected to said memory cell array for amplifying a data signal outputted from memory cells on a memory cell line selected by said line selecting means.

11. A semiconductor memory device according to claim 1, wherein said k numbers of memory cell lines include k numbers of memory cell rows on each of which memory cells are disposed.

12. A semiconductor memory device according to claim 1, which further comprises a First-In First-Out memory device for a supplied data signal.

13. A semiconductor memory device according to claim 2, which further comprises first laser trimming line means for said first designation, said first designation being performed through the cut off of said first laser trimming line means, second laser trimming line means for said second designation, said second designation being performed through the cut-off of said second laser trimming line means.

14. A FIFO memory including a ring pointer for generating at least one of row and column addresses, said ring pointer comprising K flip-flops each having a trimming node for selectively bypassing said flip-flop when a memory cell addressed thereby is defective, said ring pointer further including first and second return loops, and at least one redundancy flip-flop stage bypassed by said return loops, said first return loop including a switching circuit and a trimming node for switchably deactivating said first return loop when a memory cell addressed, by any of said K stages of said ring pointer is defective, thereby adding said at least one redundancy flip-flop stage to said ring pointer, said redundancy flip-flop stage also including a trimming node for establishing whether said redundancy flipflop stage is bypassed thus enabling addition of at least one redundancy flip-flop stage to said ring pointer.

* * * * *